(12) United States Patent
Chen et al.

(10) Patent No.: US 11,817,852 B1
(45) Date of Patent: Nov. 14, 2023

(54) ANTI-BACKFLOW OUTPUT SWITCH

(71) Applicants: Mass Power Electronics Inc., Dongguan (CN); Guangzhou Boju Information Technology Co., Ltd., Guangzhou (CN)

(72) Inventors: Wanxiong Chen, Dongguan (CN); Zanxing Luo, Dongguan (CN); Xiaosheng Zheng, Dongguan (CN); Zhuo Jia, Guangzhou (CN)

(73) Assignees: MASS POWER ELECTRONICS INC., Dongguan (CN); GUANGZHOU BOJU INFORMATION TECHNOLOGY CO., LTD., Guangzhou (CN)

( * ) Notice: Subject to any disclaimer, the term of this patent is extended or adjusted under 35 U.S.C. 154(b) by 0 days.

(21) Appl. No.: 18/179,671

(22) Filed: Mar. 7, 2023

(51) Int. Cl.
*H03K 17/06* (2006.01)
*H03K 17/16* (2006.01)
*H03K 17/687* (2006.01)

(52) U.S. Cl.
CPC ......... *H03K 17/063* (2013.01); *H03K 17/162* (2013.01); *H03K 17/6871* (2013.01); *H03K 2217/0036* (2013.01)

(58) Field of Classification Search
CPC ................. H03K 17/063; H03K 17/6871
See application file for complete search history.

(56) References Cited

FOREIGN PATENT DOCUMENTS

| CN | 206807131 U | * 12/2017 |
| CN | 113471938 A | * 10/2021 |
| CN | 114244091 A | 3/2022 |
| CN | 218037073 U | * 12/2022 |

* cited by examiner

*Primary Examiner* — Metasebia T Retebo

(57) ABSTRACT

The present disclosure discloses an anti-backflow output switch, a collector of the tertiary tube Q6 is connected to the source of the MOS tube Q4 through a resistor R24 and a diode ZD2, a resistor R30 is connected between the source and the gate of the MOS tube Q4, the drain of the MOS tube Q4 is connected to the drain of the MOS tube Q9, a resistor R25 and a diode D5 are connected to the gate of the MOS tube Q9, a resistor R28 is connected between the gate and the source of the MOS tube Q9, a resistor R33 is connected between the drain of the MOS tube Q10, a resistor R37 is connected between the gate and the source of the MOS tube Q10, the gate of the MOS tube Q10 is connected to a first pin of the chip U2 through a resistor R35, a resistor R34 and a resistor R38 are connected to the second pin and the third pin of the chip U2 respectively, a resistor R39 and a capacitor C35 are connected between the first pin and the second pin of the chip U2, the second pin of the chip U2 is connected to a fourth pin of the chip U2 through the capacitor C35 and the diode D7, and the resistor R25 is connected to the resistor R33. The advantage of the present disclosure is that the backflow problem is quickly detected and quickly blocked by using a common comparator circuit.

3 Claims, 2 Drawing Sheets

ANTI-BACKFLOW OUTPUT SWITCH

TECHNICAL FIELD OF THE DISCLOSURE

The present DISCLOSURE relates to the technical field of output switch, specifically an anti-backflow output.

BACKGROUND OF THE DISCLOSURE

Existing DC high current output switches include two types: (1) relay switches, (2) special IC switches.

(1) The advantage of the relay switches is: simple drive circuit; their disadvantages are: 1. high impact current, 2. short life, 3. slow response, 10 ms level of speed, no way to prevent backflow.

(2) The advantages of special IC switches: fast response (100 ns level); their disadvantages are: 1. expensive, 2. less optional products, 3. bad delivery time.

SUMMARY OF THE DISCLOSURE

The technical problem to be solved by the present disclosure is to provide an anti-backflow output switch that quickly detects the backflow problem and quickly blocks it by using a common comparator circuit directed to the aforesaid problem.

In order to solve the aforesaid technical problem, technical solution provided by the present disclosure is: an anti-backflow output switch, comprising a switch circuit and a detection circuit, wherein the switch circuit comprises a triode Q6, a triode Q7, a MOS tube Q4 and a MOS tube Q9, wherein a resistor R15 is connected between the base and the emitter of the triode Q6, a resistor R26 is connected to the base of triode Q7, a resistor R27 is connected between the base and emitter of the triode Q7, a collector of the triode Q7 is connected to the base of triode Q6 through a resistor R21, a collector of the tertiary tube Q6 is connected to the source of the MOS tube Q4 through a resistor R24 and a diode ZD2, a resistor R30 is connected between the source and the gate of the MOS tube Q4, a resistor R30 is connected in parallel with the diode ZD2, the drain of the MOS tube Q4 is connected to the drain of the MOS tube Q9, the gate of the MOS tube Q9 is connected to a resistor R25 and a diode D5, a resistor R28 is connected between the gate and the source of the MOS tube Q9, a resistor R28 is connected in parallel with a diode ZD3, the detection circuit comprises a chip U2 and a MOS tube Q10, the drain of the MOS tube Q10 is connected to a resistor R33, a resistor R37 is connected between the gate and the source of the MOS tube Q10, the gate of the MOS tube Q10 is connected to a first pin of the chip U2 through a resistor R35, a resistor R34 and a resistor R38 are connected to a second pin and a third pin of the chip U2 respectively, a resistor R39 and a capacitor C35 are connected between the first pin and the second pin of the chip U2, the second pin of the chip U2 is connected to a fourth pin of the chip U2 through the capacitor C35 and the diode D7, the model number of the chip U2 is LM393, and the resistor R25 is connected to the resistor R33.

The advantage of the present disclosure over the prior art lies in said anti-backflow output switch. When CH—ON is in low level, the MOS tube Q4 and the MOS tube Q9 are in the closed state, due to the back-to-back connection, their internal diodes are connected in reverse, so that none of the input current can pass through said switch to the output, moreover, the output current cannot backflow through said switch to the input. When CH—ON is in high level, the MOS tube Q4 and the MOS tube Q9 are in the open state, the input current Io can pass through this switch to the output, and the current flows from the right side of the switch to the left side, when there is a current Iin at the output to be poured to the input, first of all, Io has to drop to 0, and after that, Iin can flow from the left side to the right side. The MOS tube Q9 is turned off before the detected current drops to 0, the internal diode of the MOS tube Q9 is inverted for Iin, and Iin cannot flow through said switch circuit, which is well prevented from damaging the circuit by backflow current due to the us-level response speed of the comparator.

Further, the resistor R27 is grounded.

Further, a eighth pin of the chip U2 is connected to a capacitor C31 and a capacitor C34, and the capacitor C31 and the capacitor C34 are connected in parallel.

DETAILED DESCRIPTION OF THE PREFERRED EMBODIMENT

The present disclosure is described in further detail below in combination with the drawings the accompanying drawings.

Figure 1:
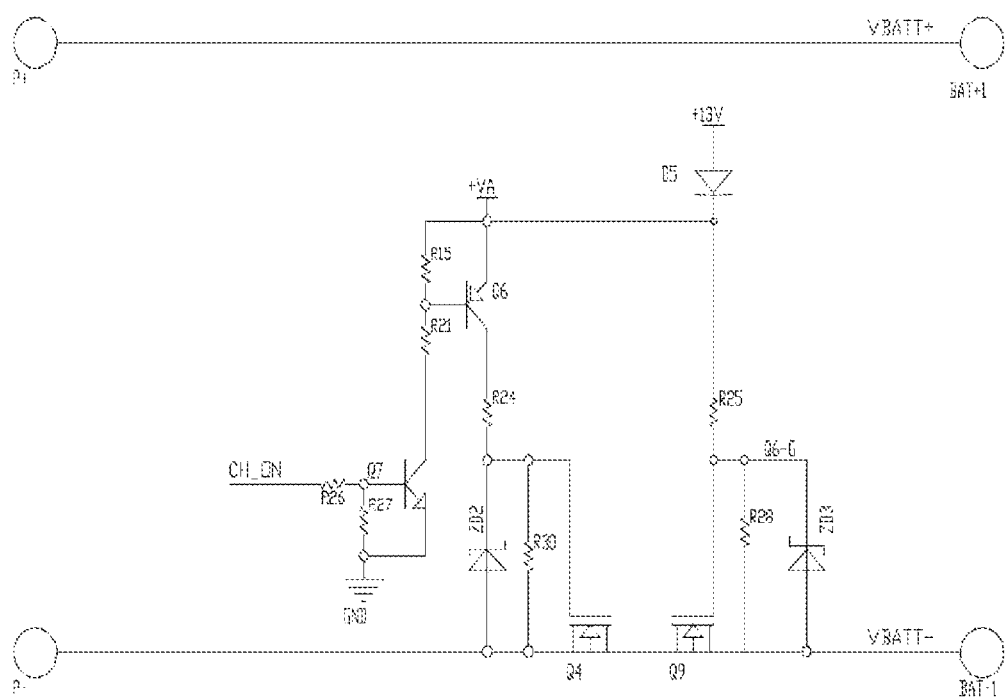
FIG. 1 is a circuit diagram of the switch circuit of the anti-backflow output switch of the present disclosure.
Figure 2:
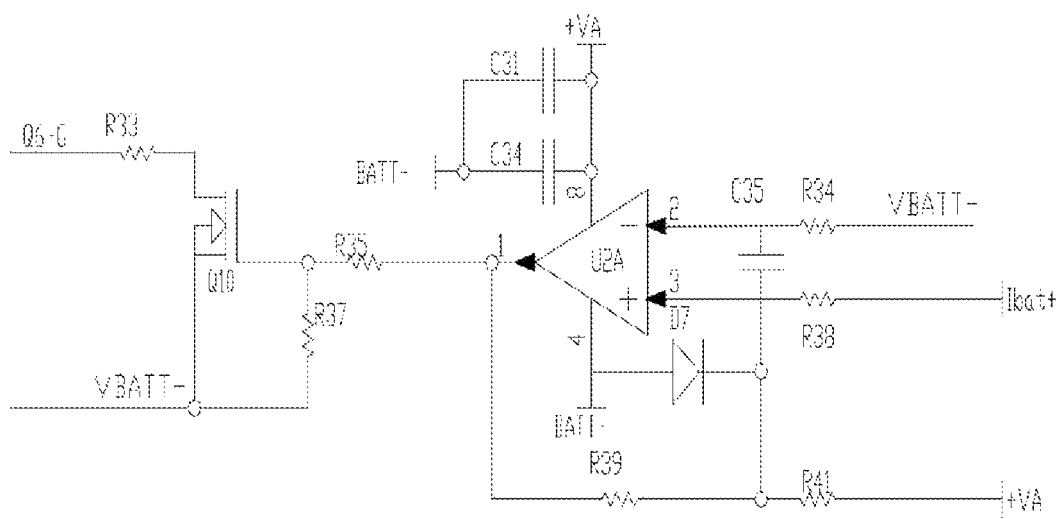
FIG. 2 is a circuit diagram of the detection circuit of the anti-backflow output switch of the present disclosure.

With reference to FIGS. 1 and 2, the switch circuit comprises a triode Q6, a triode Q7, a MOS tube Q4 and a MOS tube Q9, wherein a resistor R15 is connected between the base and the emitter of the triode Q6, a resistor R26 is connected to the base of triode Q7, a resistor R27 is connected between the base and emitter of the triode Q7, the resistor R27 is grounded, a collector of the triode Q7 is connected to the base of triode Q6 through a resistor R21, a collector of the tertiary tube Q6 is connected to the source of the MOS tube Q4 through a resistor R24 and a diode ZD2, a resistor R30 is connected between the source and the gate of the MOS tube Q4, a resistor R30 is connected in parallel with the diode ZD2, the drain of the MOS tube Q4 is connected to the drain of the MOS tube Q9, the gate of the MOS tube Q9 is connected to a resistor R25 and a diode D5, a resistor R28 is connected between the gate and the source of the MOS tube Q9, a resistor R28 is connected in parallel with a diode ZD3, the detection circuit comprises a chip U2 and a MOS tube Q10, the drain of the MOS tube Q10 is connected to a resistor R33, a resistor R37 is connected between the gate and the source of the MOS tube Q10, the gate of the MOS tube Q10 is connected to a first pin of the chip U2 through a resistor R35, a resistor R34 and a resistor R38 are connected to a second pin and a third pin of the chip U2 respectively, a resistor R39 and a capacitor C35 are connected between the first pin and the second pin of the chip U2, the second pin of the chip U2 is connected to a fourth pin of the chip U2 through the capacitor C35 and the diode D7, a eighth pin of the chip U2 is connected to a capacitor C31 and a capacitor C34, and the capacitor C31 and the capacitor C34 are connected in parallel, the model number of the chip U2 is LM393, and the resistor R25 is connected to the resistor R33.

When CH—ON is in low level, the MOS tube Q4 and the MOS tube Q9 are in the closed state, due to the back-to-back connection, their internal diodes are connected in reverse, so that none of the input current can pass through said switch to the output, moreover, the output current cannot backflow through said switch to the input.

When CH—ON is in high level, the MOS tube Q4 and the MOS tube Q9 are in the open state, the input current Io can pass through this switch to the output, and the current flows from the right side of the switch to the left side, when there is a current Iin at the output to be poured to the input, first of all, Io has to drop to 0, and after that, Iin can flow from the left side to the right side.

The MOS tube Q9 is turned off before the detected current drops to 0, the internal diode of the MOS tube Q9 is inverted for Iin, and Iin cannot flow through said switch circuit, which is well prevented from damaging the circuit by backflow current due to the us-level response speed of the comparator.

The disclosure and its embodiments have been described above, and the description is not restrictive. What is shown in the accompanying drawings is only one of the embodiments of the disclosure, and the actual structure is not limited thereto. All in all, if a person skilled in the art is inspired by it, without departing from the purpose of the disclosure, any structural modes and embodiments similar to this technical solution designed without creativity should belong to the protection scope of the disclosure.

The invention claimed is:

1. An anti-backflow output switch, comprising a switch circuit and a detection circuit, characterized in that the switch circuit comprises a first triode (Q6), a second triode (Q7), a first MOS tube (Q4) and a second MOS tube (Q9), wherein a first resistor (R15) is connected between a base and an emitter of the first triode (Q6), a second resistor (R26) is connected to a base of the second triode (Q7), a third resistor (R27) is connected between a base and an emitter of the second triode (Q7), a collector of the send triode (Q7) is connected to the base of the first triode (Q6) through a fourth resistor (R21), a collector of the first triode (Q6) is connected to a source of the first MOS tube (Q4) through a fifth resistor (R24) and a first diode (ZD2), a sixth resistor (R30) is connected between the source and a gate of the first MOS tube (Q4), the sixth resistor (R30) is connected in parallel with the first diode (ZD2), a drain of the first MOS tube (Q4) is connected to a drain of the second MOS tube (Q9), a gate of the second MOS tube (Q9) is connected to a seventh resistor (R25) and a second diode (D5), an eighth resistor (R28) is connected between the gate and a source of the second MOS tube (Q9), the eighth resistor (R28) is connected in parallel with a third diode (ZD3), the detection circuit comprises a chip (U2) and a third MOS tube (Q10), a drain of the third MOS tube (Q10) is connected to a ninth resistor (R33), a tenth resistor (R37) is connected between a gate and a source of the third MOS tube (Q10), the gate of the third MOS tube (Q10) is connected to a first pin of the chip (U2) through a eleventh resistor (R35), a twelfth resistor (R34) and a thirteenth resistor (R38) are connected to a second pin and a third pin of the chip (U2) respectively, a fourteenth resistor (R39) and a first capacitor (C35) are connected between the first pin and the second pin of the chip (U2), the second pin of the chip (U2) is connected to a fourth pin of the chip (U2) through the first capacitor (C35) and a fourth diode (D7), the model number of the chip (U2) is LM393, and the seventh resistor (R25) is connected to the ninth resistor (R33).

2. The anti-backflow output switch according to claim 1, characterized in that the third resistor (R27) is grounded.

3. The anti-backflow output switch according to claim 1, characterized in that an eighth pin of the chip (U2) is connected to a second capacitor (C31) and a third capacitor (C34), and the second capacitor (C31) and the third capacitor (C34) are connected in parallel.

* * * * *